(12) United States Patent
Slock et al.

(10) Patent No.: US 6,643,676 B1
(45) Date of Patent: Nov. 4, 2003

(54) INITIALIZATION /PREWINDOWING REMOVAL POSTPROCESSING FOR FAST RLS FILTER ADAPTATION

(75) Inventors: Dirk Slock, Vallauris (FR); Debajyoti Pal, Fremont, CA (US)

(73) Assignee: Virata Corporation, Red Bank, NJ (US)

( * ) Notice: Subject to any disclaimer, the term of this patent is extended or adjusted under 35 U.S.C. 154(b) by 0 days.

(21) Appl. No.: 09/552,010

(22) Filed: Apr. 19, 2000

(51) Int. Cl.[7] .............................................. G06F 17/10
(52) U.S. Cl. ...................................................... 708/322
(58) Field of Search ................................ 708/322, 323; 375/229, 231, 232, 233

(56) References Cited

U.S. PATENT DOCUMENTS

| | | | |
|---|---|---|---|
| 5,400,394 A | | 3/1995 | Raman et al. |
| 5,428,562 A | * | 6/1995 | Gay ............................ 708/322 |
| 5,432,816 A | * | 7/1995 | Gozzo ......................... 375/232 |
| 5,677,951 A | * | 10/1997 | Gay ....................... 379/406.08 |

* cited by examiner

*Primary Examiner*—Chuong Dinh Ngo
(74) *Attorney, Agent, or Firm*—Burns, Doane, Swecker & Mathis, L.L.P.

(57) ABSTRACT

The present invention, generally speaking, accelerates convergence of a fast RLS adaptation algorithm by, following processing of a burst of data, performing postprocessing to remove the effects of prewindowing, fictitious data initialization, or both. This postprocessing is part of a burst mode adaptation strategy in which data (signals) get processed in chunks (bursts). Such a burst mode processing approach is applicable whenever the continuous adaptation of the filter is not possible (algorithmic complexity too high to run in real time) or not required (optimal filter setting varies only slowly with time). Postprocessing consists of a series of "downdating" operations (as opposed to updating) that in effect advance the beginning point of the data window. The beginning point is advanced beyond fictitious data used for initialization and beyond a prewindowing region. In other variations, downdating is applied to data within a prewindowing region only. The forgetting factor of conventional algorithms can be eliminated entirely. Performance equivalent to that of GWC RLS algorithms is achieved at substantially lower computational cost. In particular, a postprocessing Fast Kalman Algorithm in effect transforms an initialized/prewindowed least squares estimate into a Covariance Window least squares estimate. Various further refinements are possible. Initialization may be cancelled completely or only partially. For example, in order to reduce the dynamic range of algorithmic quantities, it may be advantageous to, in a subsequent initialization, add an increment to a forward error energy quantity calculated during a previous burst. Postprocessing may then be performed to cancel only the added increment. Also, to reduce the usual large startup error transient, the desired response data can be modified in a way that dampens the error transient. The modified desired response data are saved for use in later postprocessing. Furthermore, to allow for more rapid adaptation without the use of an exponential forgetting factor, a weighting factor less than one may be applied to the forward error energy quantity during initialization from one burst to the next. This allows for the most efficient use of data but limited adaptation within a burst, but more rapid adaptation from one burst to the next.

13 Claims, 2 Drawing Sheets

INITIALIZATION /PREWINDOWING REMOVAL POSTPROCESSING FOR FAST RLS FILTER ADAPTATION

BACKGROUND OF THE INVENTION

1. Field of the Invention

The present invention relates to adaptive filters and more particularly to fast recursive least squares (fast RLS) adaptive filters.

2. State of the Art

Adaptive filters find widespread use in communications. A known class of adaptive filter is the fast RLS adaptive filter. This class of adaptive filter, or more accurately, this class of filter adaptation algorithm, is recognized for its properties of fast convergence and reduced computational complexity compared to earlier RLS algorithms (although the computational complexity is still very considerable).

In one aspect, the attractiveness of RLS algorithms lies in the ability to compute updated filter settings using a new data input together with the old filter settings. This "recursion" is performed differently in different variations of the algorithm. In one variation, designated by the term "growing window covariance" (GWC), the adaptation algorithm takes into account a growing window of data that begins at time zero, for example, and is incrementally extended at each sample time until the adaptation has concluded. In another variation, designated by the term "sliding window covariance" (SWC), the adaptation algorithm takes into account a window of data that at a particular point in the algorithm becomes fixed in size. In the SWC algorithm, once the size of the data window has been fixed, as updates are computed, they incorporate knowledge from a new sample and "disincorporate" knowledge from an oldest sample.

In general, various different methods of windowing the input data of an adaptive filter are known. In order to achieve a favorable mathematical structure for computational efficiency, the most common implementations of the fast RLS algorithm use prewindowing. The prewindowing method makes the assumption that the input data prior to time zero are zero. This assumption results in a "prewindowing transient" during which the error quantity is unusually large. In other words, prewindowing perturbs the algorithm, delaying convergence. The GWC version of RLS does not require prewindowing. Without prewindowing, however, the RLS algorithm becomes computationally more burdensome and more implementation-sensitive.

Initialization also perturbs the algorithm. As described in J. M. Cioffi and T. Kailath, "Fast, recursive least squares transversal filters for adaptive filtering", IEEE Trans. on ASSP, ASSP-32(2):304–337, April 1984, more rapid convergence may be obtained by initializing the input data matrix with a sparse "fictitious" data submatrix located within a region corresponding to negative time. A sample covariance matrix is then initialized so as to be in agreement with the fictitious data. A desired response data vector (or matrix) may also be initialized with some fictitious data to reflect prior information on the filter settings. These initialization techniques may be referred to as "soft constraint initialization". As compared to initializing the same quantities with zeros, the foregoing technique may significantly reduce the amount of perturbation experienced by the algorithm if the prior information is correct. Substantial perturbation remains, however, if the assumed prior information is incorrect, as is usually the case.

In order to overcome the deleterious effects of prewindowing and initialization, an exponential "forgetting factor" is commonly used. As more and more data is processed, the influence of old data becomes exponentially more attenuated. Besides forgetting "incorrect" data, however, the same forgetting also gets applied to actual data, with the result that the total amount of data available is used less than efficiently. If this forgetting factor could be eliminated entirely, the result would be better estimation performance and fewer numerical problems.

Further background information concerning RLS adaptation algorithms may be found in the following references, incorporated herein by reference:

T. Kailath, Lectures on Wiener and Kalman Filtering, Springer-Verlag, Wien—New York, 1981.

S. Haykin, Adaptive Filter Theory, Prentice-Hall, Englewood Cliffs, N.J., 1995, third edition.

B. Widrow and S. D. Stearns, Adaptive Signal Processing, Prentice-Hall, Englewood Cliffs, N.J., 1985.

B. Widrow and E. Walach, "On the Statistical Efficiency of the LMS Algorithm with Nonstationary Inputs", IEEE Trans. on Information Theory, IT-30(2):211–221, March 1984, Special Issue on Adaptive Filtering.

D. T. M. Slock, "On the Convergence Behavior of the LMS and the Normalized LMS Algorithms", IEEE Trans. on Signal Processing, 41(9):2811–2825, September 1993.

S. M. Kay, Fundamentals of Statistical Signal Processing: Estimation Theory, Prentice Hall 1993.

E. Eleftheriou and D. Falconer, "Tracking Properties and Steady-State Performance of RLS Adaptive Filter Algorithms", IEEE Trans. ASSP, ASSP-34(5): 1097–1110, October 1986.

D. D. Falconer and L. Ljung, "Application of Fast Kalman Estimation to Adaptive Equalization", IEEE Trans. Com., COM-26(10):1439–1446, October 1978.

J. M. Cioffi and T. Kailath, "Fast, recursive least squares transversal filters for adaptive filtering", IEEE Trans. on ASSP, ASSP-32(2):304–337, April 1984.

D. T. M. Slock and T. Kailath, "Numerically Stable Fast Transversal Filters for Recursive Least Squares Adaptive Filtering", IEEE Trans. Signal Proc., ASSP-39(1): 92–114, January 1991.

D. T. M. Slock, "Backward Consistency Concept and Round-Off Error Propagation Dynamics in Recursive Least Squares Algorithms", Optical Engineering, 31(6): 1153–1169, June 1992.

J. M. Cioffi and T. Kailath, "Windowed Fast Transversal Filters Adaptive Algorithms with Normalization", IEEE Trans. on ASSP, ASSP-33(3):607–625, June 1985.

J. M. Cioffi, "The Block-Processing FTF Adaptive Algorithm", IEEE Trans. on ASSP, ASSP 34(1):77–90, February 1986.

SUMMARY OF THE INVENTION

The present invention, generally speaking, accelerates convergence of a fast RLS adaptation algorithm by, following processing of a burst of data, performing postprocessing to remove the effects of prewindowing, fictitious data initialization, or both. This postprocessing is part of a burst mode adaptation strategy in which data (signals) get processed in chunks (bursts). Such a burst mode processing approach is applicable whenever the continuous adaptation of the filter is not possible (algorithmic complexity too high to run in real time) or not required (optimal filter setting varies only slowly with time). Postprocessing consists of a series of "downdating" operations (as opposed to updating) that in effect advance the beginning point of the data window. The beginning point is advanced beyond fictitious data used for initialization and beyond a prewindowing region. In other variations, downdating is applied to data within a prewindowing region only. The forgetting factor of conventional algorithms can be eliminated entirely. Performance equivalent to that of GWC RLS algorithms is achieved at substantially lower computational cost. In particular, a postprocessing Fast Kalman Algorithm in effect transforms an initialized/prewindowed least squares estimate into a Covariance Window least squares estimate. Various further refinements are possible. Initialization may be cancelled completely or only partially. For example, in order to reduce the dynamic range of algorithmic quantities, it may be advantageous to, in a subsequent initialization, add an increment to a forward error energy quantity calculated during a previous burst. Postprocessing may then be performed to cancel only the added increment. Also, to reduce the usual large startup error transient, the desired response data can be modified in a way that dampens the error transient. The modified desired response data are saved for use in later postprocessing. Furthermore, to allow for more rapid adaptation without the use of an exponential forgetting factor, a weighting factor less than one may be applied to the forward error energy quantity during initialization from one burst to the next. This allows for the most efficient use of data but limited adaptation within a burst, but more rapid adaptation from one burst to the next.

BRIEF DESCRIPTION OF THE DRAWING

The present invention may be further understood from the following description in conjunction with the appended drawing. In the drawing.

DETAILED DESCRIPTION OF THE PREFERRED EMBODIMENTS

In the following description, details are described of an advantageous postprocessing algorithm that may be used to remove the effects of prewindowing and/or initialization and hence accelerate convergence of a fast RLS adaptation algorithm. For purposes of illustration only, the example of a fractionally-spaced (FS) decision feedback equalizer (DFE) is considered. Such an FS DFE finds particular application in xDSL modems; however, the technique described is broadly applicable to filter adaptation in all fields of application. In a concrete embodiment, an example is given of a fast RLS algorithm that can be used in conjunction with the postprocessing procedure. Many of the algorithmic details of the fast RLS algorithm and the postprocessing procedure are themselves familiar from the published literature. Different internal variables and recursive relations can be used to implement the same strategies. To explain the initialization removal operation, the interpretation of initialization as the result of processing fictitious data is explained in detail.

Fractionally-Spaced Decision Feedback Equalization

Figure 1:
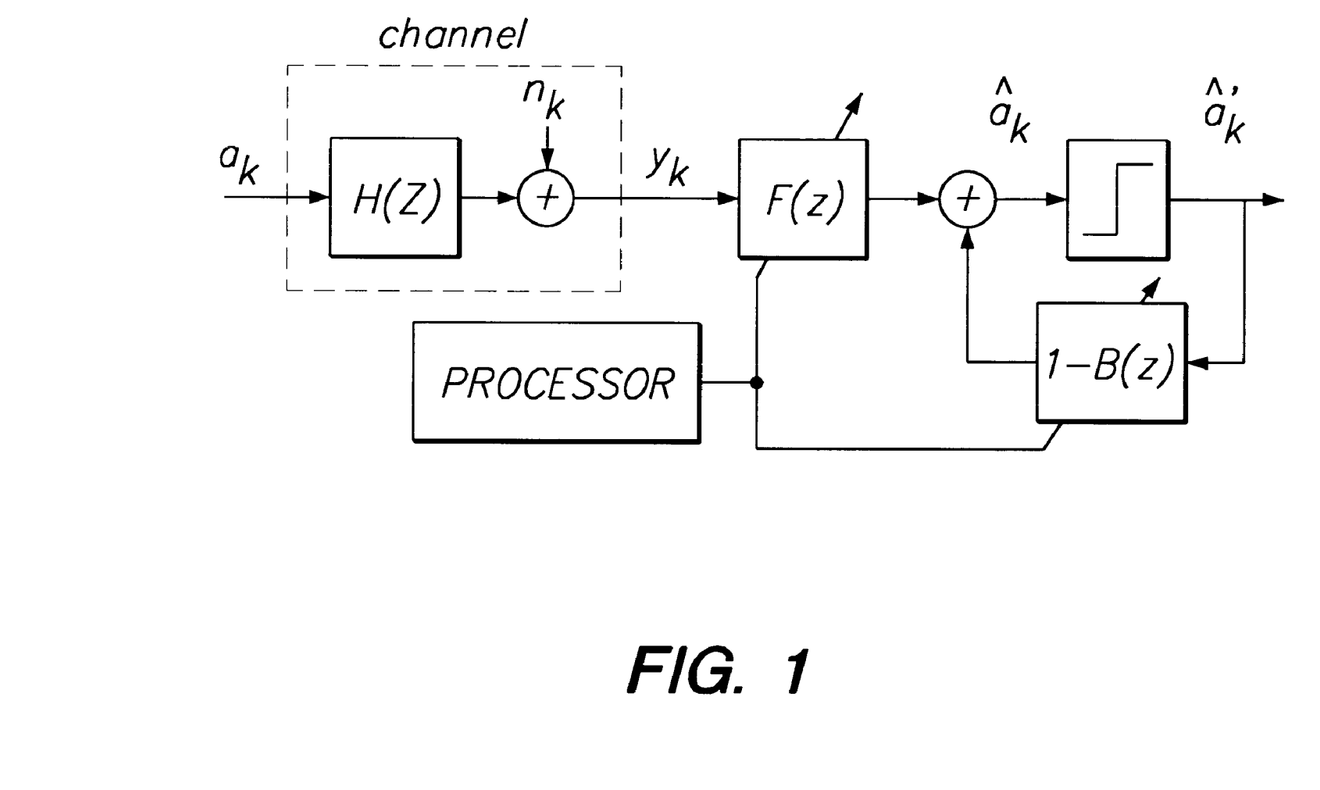
FIG. 1 is a block diagram of an equalizer with which the present invention may be used.

Consider the channel equalization application depicted in FIG. 1. Bits get mapped into (scalar valued) symbols $a_k$ belonging to some finite alphabet (e.g. $\{-1,+1\}$), which then modulate (linearly) a certain pulse shape. The resulting signal gets transmitted over a channel that is assumed to be linear and time-invariant and hence can be represented by a certain channel impulse response. Noise and interference get added during the transmission. At the receiver, the signal gets lowpass filtered and sampled. Assume the sampling rate to be twice the symbol rate. Then the even and odd received samples can be considered as two symbol rate sequences, which together constitute one vector valued symbol rate sequence:

$$y_k = \begin{bmatrix} y(t_0 + kT) \\ y\left(t_0 + \left(k + \frac{1}{2}\right)T\right) \end{bmatrix}$$

where T is the symbol period and the time offset to determines the phase of the sampling operation. The whole system taking the symbols $a_k$ as input and producing the 2×1 vector samples $y_k$ as output is a discrete-time system operating at the symbol rate. The 2×1 transfer function H(z) indicated in FIG. 1 represents the even and odd samples of the convolution of a transmission filter (pulse shape), channel transfer function and receiver filter. Consider now a Decision-Feedback Equalizer (DFE) with feedforward filter F(z) (1×2) and feedback filter 1−B(z). In FIG. 1, F(z) is assumed to be potentially non-causal and hence leads the DFE to produce undelayed symbol estimates $â_k$. However, in practice and in the equations below, the filter F(z) is assumed to be causal so that the DFE produces symbol estimates $â_{k-d}$ with a certain delay d. Then the DFE output becomes:

$$â_{k-d} = (1 - B(z))a_{k-d} + F(z)y_k = -\sum_{i=1}^{n_B} b(i)a_{k-d-i} + \sum_{i=0}^{n_F-1} f(i)y_{k-i}.$$

where the symbol estimate is delayed with respect to the received signal. An equalization error $\tilde{a}_{k-d}$ can be formed by subtracting the equalizer output $â_{k-d}$ (symbol estimate) from the true symbol $a_{k-d}$. The equalization error can be written as:

$$\tilde{a}_{k-d} = a_{k-d} - â_{k-d}$$
$$= B(z)a_{k-d} - F(z)y_k$$
$$= \sum_{i=0}^{n_B} b(i)a_{k-d-i} - \sum_{i=0}^{n_F-1} f(i)y_{k-i}$$
$$= BA_{k-d} - FY_k, \quad b(0) = 1$$

where the b(i) are scalars and the f(i) are 1×2 vectors.

The true symbols $a_{k-d}$ are available during the so-called training period of the equalizer. After the training period, when processing actual data, the true symbol $a_{k-d}$ can be replaced by a decision $â'_{k-d}$ based on the equalizer output $â_{k-d}$. The decision is obtained (in the absence of channel coding) by passing the equalizer output through a slicer, as indicated in FIG. 1. The slicer takes the element from the symbol constellation that is closest to the equalizer output. Unless a decision error occurs, $â'_{k-d}=a_{k-d}$. The equalization error is used by adaptive filtering algorithms to adapt the equalizer filter settings. The adaptation of the equalizer with actual data through the use of $â'_{k-d}$ is called the decision-directed mode. Define the following:

$$d_k = a_{k-d}, \quad s_k = a_{k-d-1}$$

where $d_k$ denotes the desired-response signal for the equalizer and $s_k$ is the input signal to the feedback filter. Note that $s_k=d_{k-1}$: the input to the feedback filter consists of past symbols/decisions.

With the T/2 feedforward filter spacing considered here, there results, in fast RLS terminology, 3 channels (symbol rate filter input streams): past symbols ($s_k$) and even and odd received samples (the two components of $y_k$). The filtering (equalization) error can be rewritten as:

$$\epsilon_k(W) = d_k - WU_k = d_k - \sum_{i=1}^{N} w(i)U_k(i)$$

where $W=[-b(1) \ldots -b(n_B) \; f(0) \ldots f(n_F-1)]$, $U_k=[s_k \ldots s_{k-n_B+1} \; Y_k^T \ldots Y_{k-n_F+1}^T]^T$ and super-script$^T$ denotes matrix transposition. The input data vector $U_k$ is a column vector, whereas filter coefficient vectors such as W will be denoted by row vectors. This allows filter outputs to be written as $WU_k$ without tranposes. $N=n_B+2n_F=N_{fb}+N_{ff}$ is the total filter order (total number of filter coefficients).

Prewindowed Least-squares Data Structure

Figure 2:
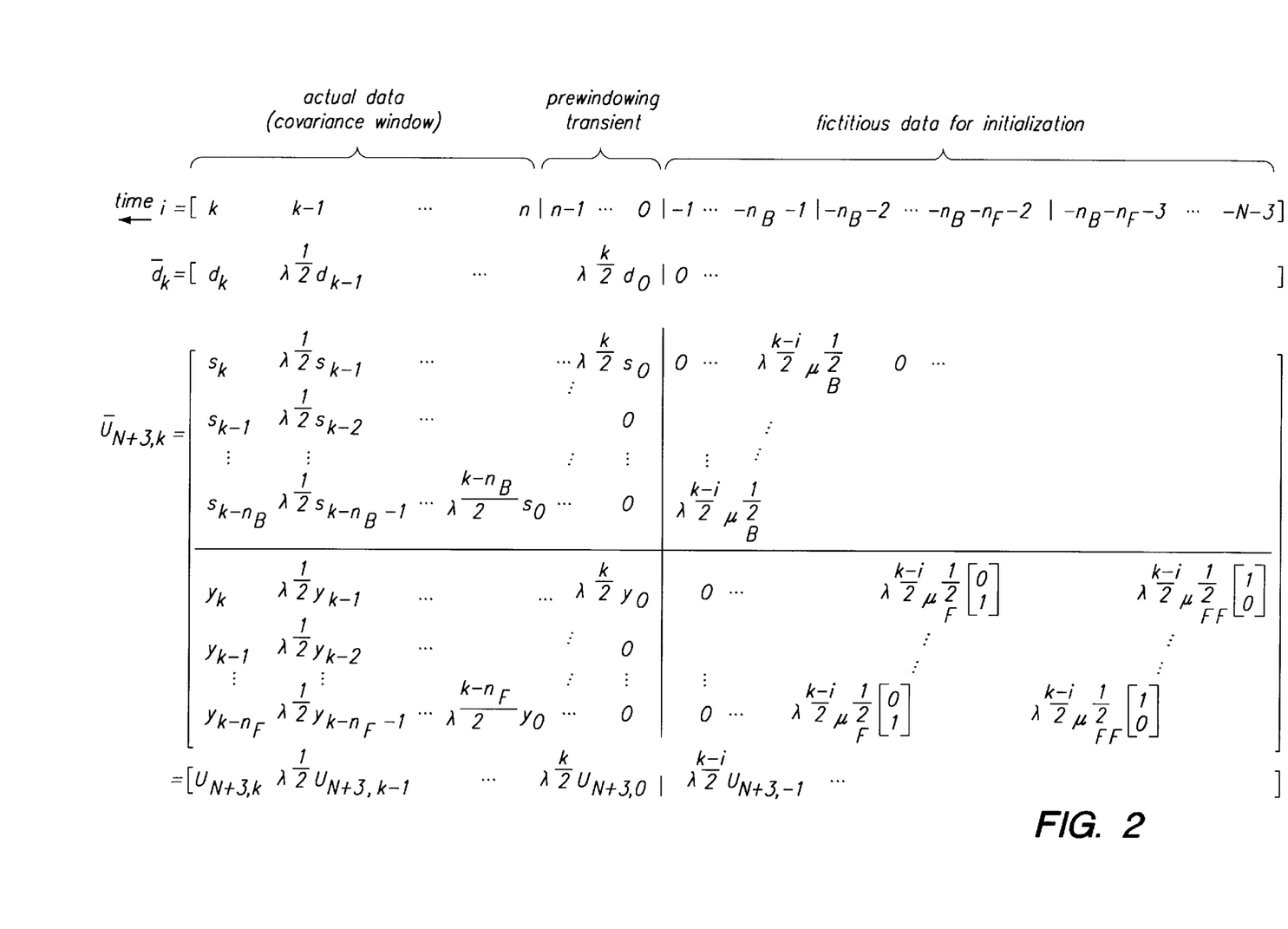
FIG. 2 is a diagram illustrating initialization of the adaptive filters of the equalizer of FIG. 1.

To understand the origins of fast RLS algorithms, it is essential to pay particular attention to the structure of the data in the least-squares criterion used to determine the filter settings. The structure of the data for the prewindowed least-squares criterion applicable to the DFE filter coefficients is shown in FIG. 2. The top line indicates (discrete) time, progressing to the left, with variable time index i. Assume that the LS problem is formulated with the data available at time i=k. In the prewindowing formulation, it is assumed that the signals are zero before time i=0. So the signals are assumed to start at time i=0. For the equalizer application, if the filter adaptation is to start as soon as training data are available, then the time origin should be chosen such that $s_0=a_{31\;d-1}$ is the first available training sequence symbol.

The second line in FIG. 2 contains the desired-response signal in the row vector $\bar{d}_k$. The structure of $\bar{d}_k$ reflects the prewindowing. Also indicated in $\bar{d}_k$ is an exponential forgetting/weighting factor $\lambda \in (0, 1]$. Actually, the data are weighted by $\sqrt{\lambda}$ so that the squared errors in the least-squares criterion to be considered below will be weighted by $(\sqrt{\lambda})^2=\lambda$. The exponential weighting reduces the influence of past data exponentially fast so that the LS filter solution will be reflecting the characteristics of the most recent data, in case these characteristics vary with time. A corresponding time constant $$\frac{1}{1-\lambda}$$

is implied by the exponential weighting.

The matrix $\bar{U}_{N+3,k}$ in FIG. 2 is the extended input data matrix. $\bar{U}_{N+3,k}$ is a structured matrix. For the DFE problem at hand, it consists of two structured submatrices. The top submatrix is filled with the signal $s_i$ and has a Hankel structure (if $\lambda=1$): elements along any anti-diagonal are constant. This Hankel structure is perturbed by the exponential weighting, which weighs consecutive columns more and more. The bottom submatrix of $\bar{U}_{N+3,k}$ is block Hankel (if $\lambda=1$) and is filled with the 2×1 vector signal (blocks) $y_i$. The data matrix $\bar{U}_{N+3,k}$ is called extended because it contains $n_B+1$ rows of signal $s_i$ and $n_F+1$ (block) rows of signal $y_i$ so it has in fact $n_B+1+2(n_F+1)=N+3$ rows (one extra row per input channel). The extended data matrix will be required for the fast RLS algorithms. If the bottom row with signal $\bar{s}_{k-n_B}$ and the bottom (block) row with signal $\bar{y}_{k-n_F}$ are removed from $\bar{U}_{N+3,k}$, then there results the regular input data matrix $\bar{U}_{N,k}=\bar{U}_k$ with N rows. The columns of the matrix $\bar{U}_k$ are the weighted input data vectors $$\lambda^{\frac{k-i}{2}} U_i$$

which upon multiplication with the filter coefficient vector W gives the weighted DFE output $$\lambda^{\frac{k-i}{2}} WU_i$$

at time i.

The n that is indicated in FIG. 2 denotes $n=\max\{n_B, n_F\}$ (though the figure is drawn assuming that $n_B=n_F=n$). The extended data vectors $U_{N+3,i}$ with time in the range $i \in [0,n-1]$ contain some samples of signal $s_i$ and/or $y_i$ situated at negative time. Those samples are not available if sampling occurs beginning from time i=0 onwards. In the prewindowing assumption, those samples are set equal to zero. This means that the data vectors $U_{N+3,i}$ contain zeros over the indicated time range, which can be called the prewindowing transient period. Hence, within this period of n discrete-time instants, the extended data vectors $U_{N+3,i}$ do not fully contain genuine data.

In order to make an RLS algorithm start from well-defined quantities, some initialization needs to be provided. Such an initialization can be provided by introducing fictitious data at negative time as long as the prewindowing (data is zero before the fictitious data) and the particular structure of the (extended) input data matrix remain preserved. The structure of the fictitious data should preferably be such that the filter coefficients and all other quantities to be initialized at time k=-1 can be determined without computation. The simplest structure for such fictitious input data consists of one non-zero sample per input channel, positioned in such a way that there is no overlap between channels in the extended data matrix. The only non-zero input samples at negative time i<0 are:

$$s_{-n_B-1} = \sqrt{\mu_B}, \; y_{-n_B-n_F-2} = \sqrt{\mu_F}\begin{bmatrix}0\\1\end{bmatrix}, \; y_{-n_B-2n_F-3} = \sqrt{\frac{\mu_F}{\lambda^{n_F+1}}}\begin{bmatrix}1\\0\end{bmatrix}.$$

This results in the following diagonal initial sample covariance matrix:

$$R_{-1}=\bar{U}_{-1}\bar{U}_{-1}^T=\text{blockdiag}\{\mu_B \Lambda_{n_B}, \lambda^{n_B+1}\mu_F \Lambda_{n_F} \hat{x} I_2\}, \Lambda_n=\text{diag}\{\lambda^n, \ldots, \lambda\}$$

where $\hat{x}$ denotes the Kronecker product ($A\hat{x}B=[A_{ij}B]$). FIG. 2 is simplified by defining $$\mu_{FF}^{\frac{1}{2}} = \lambda^{-\frac{n_F+1}{2}} \mu_F^{\frac{1}{2}}.$$

Also, whenever $$\lambda^{\frac{k-i}{2}}$$

with variable i appears, the value for i is actually the value indicated in the top row of the figure, in the same column.

If the DFE filter coefficients are to be initialized to a nonzero value, $W_{-1}\neq 0$, then the portion of the desired-response signal at negative time should reflect this: $\bar{d}_{-1}=W_{-1}\bar{U}_{-1}$.

The Least-Squares Filtering Problem

An optimal (Wiener filtering) design of the filter W corresponds to minimizing the expected value (i.e., mean value or statistical average) of the squared filtering error (Minimum Mean Squared Error (MMSE) design):

$$W^o = \arg\min_W E\epsilon_k^2(W).$$

The optimization of the MSE criterion however requires knowledge of the joint second-order statistics of the desired-response and input signals. In practice, these statistics are usually not available. However, (portions of) the desired-response and input signals are usually available. So in practice the statistical averaging operation in the MSE criterion must be dropped or replaced by another averaging operation.

In the Least-Mean-Square (LMS) algorithm, the instantaneous squared error is taken as the criterion, and a simple steepest-descent optimization strategy with one iteration per sample period is applied. The LMS algorithm uses data quite inefficiently and hence requires quite a bit of data to converge to (approximately) the optimal filter setting $W^o$.

In the Least-Squares (LS) approach, the statistical averaging is replaced by a temporal averaging. So in the LS approach, the filter settings are determined by minimizing the temporally averaged squared filtering error or, equivalently, the sum of squared errors. If signals have been accumulated from time i=0 to time i=k, then genuine data vectors are available in the time window [n−1, k] (also called covariance window), and hence the filter coefficients W can be determined from the LS cost function:

$$W_k = \arg\min_W \sum_{i=n-1}^{k} \epsilon_i^2(W) = \arg\min_W \sum_{i=n-1}^{k} (d_i - WU_i)^2.$$

Note that for the actual data vectors $U_i$, the prewindowing transient period lasts one instant less than for the extended data vectors $U_{n+3,i}$.

The LS criterion is often solved recursively, meaning that as a new signal sample becomes available, the new filter solution is determined from the old one instead of solving the new LS criterion all over again. The resulting algorithm is called the Recursive LS (RLS) algorithm. In the context of the RLS algorithm, it is important to note that the solution of the LS criterion only becomes well-defined when the number of terms in the sum of squared errors becomes at least equal to the number of coefficients N to be determined. To make the criterion well-defined even with only one or even zero terms in the sum of squared errors, an initialization term gets added to the sum of squared errors to yield the augmented LS criterion $$W_k = \arg\min_W \left( \sum_{i=n-1}^{k} \epsilon_i^2(W) + (W - W_{-1})(R_{-1}(W - W_{-1})^T \right)$$

where $R_{-1}$ is some positive definite symmetric matrix. Note that with zero terms in the sum of squares, the solution of this criterion yields $W=W_{-1}$. The augmented LS cost function has an optimality property from the point of view of estimation theory, applied to the estimation of the filter coefficients W. Indeed, this LS criterion leads to the so-called Bayesian estimate of W if the optimal error signal $\epsilon_i(W^o)$ is white Gaussian noise (with variance $\xi^o$) that is independent of the input signal(s) and prior information exists on the filter settings W in the form of a Gaussian distribution with mean $W_{-1}$ and covariance matrix $\xi^o R_{-1}^{-1}$. So, the larger $R_{-1}$, the closer $W_{-1}$ should be to the optimal filter $W^o$. In practice however, often little information is available on $W^o$ and hence $W_{-1}$ is often chosen arbitrarily (e.g. $W_{-1}=0$) and $R_{-1}$ is taken as small as possible (typically as small as the numerical implementation of the algorithm safely permits). In general, regardless of the initialization, the solution $W_k$ of the augmented LS cost function converges to the optimal solution $W^o$ as the amount of data k tends to infinity. This is because time averages converge to statistical averages for most signals.

In order to dampen even further the influence of the initialization (or in general, to permit the RLS algorithm to track possible changes with time in the joint statistics of input and desired-response signals), exponential weighting can be introduced. The effect of this is that the past gets forgotten exponentially fast. With an exponential weighting factor $\lambda \in (0, 1]$, the LS criterion becomes $$W_k = \arg\min_W \left( \sum_{i=n-1}^{k} \lambda^{k-i}\epsilon_i^2(W) + \lambda^{k+1}(W - W_{-1})(R_{-1}(W - W_{-1})^T \right).$$

With $\lambda<1$ however, the filter solution $W_k$ will never exactly converge to the optimal filter $W^o$ because even as k tends to infinity, the total effective amount of data in the cost function becomes constant, commensurate with the time constant $1/1-\lambda$ of the exponential window. This is the price to be paid to be able to forget the past quickly. So if the goal is to optimize the filter setting $W_k$ at a certain finite time instant k, the forgetting factor $\lambda$ should be carefully designed, taking both estimation quality and numerical effects into account.

Finally, in order to more easily allow the derivation of a so-called fast RLS algorithm, the prewindowing transient period may be incorporated into the LS cost function, leading to:

$$\begin{aligned} W_k &= \arg\min_W \left( \sum_{i=0}^{k} \lambda^{k-i}\epsilon_i^2(W) + \lambda^{k+1}(W - W_{-1})R_{-1}(W - W_{-1})^T \right) \\ &= \arg\min_W \sum_{i=-N-3}^{k} \lambda^{k-i}\epsilon_i^2(W) = \arg\min_W \sum_{i=-\infty}^{k} \lambda^{k-i}\epsilon_i^2(W) \\ &= \arg\min_W \|\bar{e}_k(W)\|^2 = \arg\min_W \|\bar{d}_k - W\bar{U}_k\|^2 \end{aligned} \quad (1)$$

The optimal error signal in this case is:

$$\bar{e}_k = \bar{e}_k(W_k) = [1 - W_k]\begin{bmatrix} \bar{d}_k \\ \bar{U}_k \end{bmatrix} = \begin{bmatrix} \epsilon_k & \sqrt{\lambda} & \epsilon_{k-1}(W_k) \\ =\epsilon_k(W_k) & =\epsilon_{k-1}=\epsilon_{k-1}(W_{k-1}) & \cdots \end{bmatrix}.$$

The orthogonality principle of LS leads to:

$$\bar{e}_k \bar{U}_k^T = 0 \Rightarrow \bar{e}_k \bar{e}_k^T = \bar{e}_k \bar{d}_k^T - \underbrace{\bar{e}_k \bar{U}_k^T}_{=0} W_k^T = \bar{e}_k \bar{d}_k^T.$$

The normal equations are hence:

$$[1 - W_k]\begin{bmatrix} \bar{d}_k \\ \bar{U}_k \end{bmatrix}[\bar{d}_k^T \, \bar{U}_k^T] = [1 - W_k]\underbrace{\begin{bmatrix} \bar{d}_k\bar{d}_k^T & \bar{d}_k\bar{U}_k^T \\ \bar{U}_k\bar{d}_k^T & \bar{U}_k\bar{U}_k^T \end{bmatrix}}_{R_k^e} = [\bar{\epsilon}_k\bar{\epsilon}_k^T \, 0]$$

where $R_k^e$ is an extended sample covariance matrix (as compared to the regular sample covariance matrix $R_k = \bar{U}_k \bar{U}_k^T$), and $\xi_k$ is the minimum value of the LS criterion. The solution to the normal equations is:

$$W_k R_k = \bar{d}_k \bar{U}_k^T$$

$$\xi_k = \bar{d}_k\bar{d}_k^T - W_k\bar{U}_k\bar{d}_k^T = \bar{d}_k\bar{d}_k^T - \bar{d}_k\bar{U}_k^T(\bar{U}_k\bar{U}_k^T)^{-1}\bar{U}_k\bar{d}_k^T.$$

Recursive Least-squares (RLS) Algorithm

From the recursive relations:

$$\begin{cases} \bar{d}_k \bar{U}_k^T = \lambda \bar{d}_{k-1}\bar{U}_{k-1}^T + d_k U_k^T \\ R_k = \lambda R_{k-1} + U_k U_k^T \end{cases}$$

the following recursion is obtained for $W_k$:

$$W_k = W_{k-1} + \underbrace{(d_k - W_{k-1}U_k)}_{\epsilon_k^p = \epsilon_k(W_{k-1})} \underbrace{U_k^T R_k^{-1}}_{C_k} = W_{k-1} + \epsilon_k^p C_k$$

where $\epsilon_k^p$ is the "predicted" (or a priori) error signal (predicted using the previous filter setting $W_{k-1}$) and $C_k$ is the Kalman gain. Note that $C_k$ is like $W_k$ with $\bar{d}_k$ replaced by a $\bar{\sigma} = [1 \, 0 \, \ldots]$: $C_k = \bar{\sigma}\bar{U}_k^T R_k^{-1} = U_k^T R_k^{-1}$. The quantity $\bar{\sigma}$ is called the pinning vector—it pins down the most recent sample, e.g., $\bar{U}_k\bar{\sigma}^T = U_k$. The Kalman gain $C_k$ is the filter for estimating $\bar{\sigma}$ from $\bar{U}_k$ with error signal given by $\bar{\sigma} - C_k\bar{U}_k$ and error energy given by $(\bar{\sigma} - C_k\bar{U}_k)\bar{\sigma}^T = 1 - C_k U_k = 1 - U_k^T R_k^{-1} U_k = \gamma_k$, which equals the last component of the corresponding error signal. The quantity $\gamma_k \in (0, 1]$ is often called the likelihood variable. It can be considered to be the RLS adaptation gain. Indeed, we get for the a posteriori (after updating $W_k$) error signal:

$$\epsilon_k = \epsilon_k(W_k) = d_k - W_k U_k = \overline{d_k - W_{k-1}U_k} - \epsilon_k^p C_k U_k$$
$$= \epsilon_k^p(1 - C_k U_k) = \epsilon_k^p \gamma_k$$

To find a recursion for $R_k^{-1}$ the Matrix Inversion Lemma is applied on $R_k = \lambda R_{k-1} + U_k U_k^T$, which leads naturally to the introduction of $$\tilde{C}_k = U_k^T \lambda^{-1} R_{k-1}^{-1} = \gamma_k^{-1} C_k = \text{overnormalized Kalman gain.}$$

The RLS algorithm can then be formulated, which is a recursion for $W_{k-1}$, $R_{k-1}^{-1} \to W_k$, $R_k^{-1}$ with initialization $W_{-1}, R_{-1}^{-1}$:

$$\begin{cases} \epsilon_k^p = d_k - W_{k-1}U_k \\ \tilde{C}_k = U_k^T \lambda^{-1} R_{k-1}^{-1} \\ \gamma_k = (1 + \tilde{C}_k U_k)^{-1} \\ W_k = W_{k-1} + \epsilon_k^p \gamma_k \tilde{C}_k \\ R_k^{-1} = \lambda^{-1} R_{k-1}^{-1} - \tilde{C}_k^T \gamma_k \tilde{C}_k \text{ Riccati equation.} \end{cases}$$

The algorithm described above leads to the lowest complexity, but some algorithmic variations involving $C_k$ instead of $\tilde{C}_k$ are possible by exploiting the relations $$\epsilon_k^p \gamma_k \tilde{C}_k = \epsilon_k^p C_k = \epsilon_k \tilde{C}_k,$$

$$\tilde{C}_k^T \gamma_k \tilde{C}_k = C_k^T \gamma_k^{-1} C_k.$$

An update equation for the LS error energy can also be obtained (if desired):

$$\xi_k = \lambda \xi_{k-1} + \epsilon_k \epsilon_k^{pT}$$

where the latter transposition operation is required only if $\epsilon_k^p$ would have been a vector signal (not the case for a DFE).

Fast RLS Algorithms

Study of the input data structure reveals that permutation matrices $P_A$, $P_D(P_A^{-1} = P_A^T, P_D^{-1 \, D} = P_D^T)$ can be introduced to isolate the latest data $\bar{u}_k =$ $$\bar{u}_k = \begin{bmatrix} \bar{s}_k \\ \bar{y}_k \end{bmatrix}$$

or the oldest data $\bar{u}'_k =$ $$\bar{u}'_k = \begin{bmatrix} \bar{s}_{k-n_B} \\ \bar{y}_{k-n_F} \end{bmatrix}$$

in the extended data matrix $\bar{U}_{N+3,k}$, with a regular data matrix $\bar{U}_k$ or $\bar{U}_{k-1}$ the complementary part:

$$P_A \bar{U}_{N+3,k} = \begin{bmatrix} \bar{u}_k \\ \bar{U}_{k-1} \end{bmatrix} = \begin{bmatrix} \begin{bmatrix} \bar{s}_k \\ \bar{y}_k \end{bmatrix} \\ \bar{U}_{k-1} \end{bmatrix},$$

$$P_D \bar{U}_{N+3,k} = \begin{bmatrix} \bar{u}'_k \\ \bar{U}_k \end{bmatrix} = \begin{bmatrix} \begin{bmatrix} s_{k-n_B} \\ y_{k-n_F} \end{bmatrix} \\ \bar{U}_k \end{bmatrix}.$$

This leads to the following "shift time update" structure:

$$\begin{bmatrix} \bar{u}'_k \\ \bar{U}_k \end{bmatrix} = P_D \bar{U}_{N+3,k} = P_D P_A^T \begin{bmatrix} \bar{u}_k \\ \bar{U}_{k-1} \end{bmatrix}$$

which means that going from the old data $\bar{U}_{k-1}$ to the new data $\bar{U}_k$ can be accomplished by shifting in new data $\bar{u}_k$ (temporarily leading to an extended data matrix $\bar{U}_{N+3,k}$) and shifting out old data $\bar{u}'_k$. This shift time update structure allows for the derivation of fast RLS algorithms. These algorithms require the introduction of forward and backward prediction quantities to account for the introduction of new and the discarding of old data, as follows:

Forward Prediction Backward Prediction Error Signal $$\bar{e}_k = \bar{u}_k - \underline{A}_k \bar{U}_{k-1}, \bar{r}_k = \bar{u}'_k \underline{D}_k \bar{U}_k$$

$$e_k = \bar{e}_k \bar{\sigma}^T, r_k = \bar{r}_k \bar{\sigma}^T$$

Filter $$\underline{A}_k = \bar{u}_k \bar{U}_{k-1}{}^T R_{k-1}{}^{-1}, \underline{D}_k = \bar{u}'_k \bar{U}_k{}^T R_k{}^{-1}$$

$$A_k = [I_3 - \underline{A}_k] P_A, D_k = [I_3 - \underline{D}_k] P_D$$

Error Energy $$\alpha_k = \bar{e}_k \bar{e}_k{}^T = \bar{e}_k \bar{u}_k{}^T, \beta_k = \bar{r}_k \bar{r}_k{}^T = \bar{r}_k \bar{u}'_k{}^T$$

The introduction of these prediction quantities allows for an alternative update of the Kalman gain and the likelihood variable that does not involve the Riccati equation. The update of the prediction quantities themselves can then be done in the same fashion as the update for the filter $W_k$ and the error energy $\xi_k$. The update of the Kalman gain and likelihood variable requires the introduction of an extended Kalman gain and likelihood variable $$C_{N+3,k} = U^T_{N+3,k} R^{-1}_{N+3,k} = \gamma_{N+3,k} \tilde{C}_{N+3,k},$$

$$\tilde{C}_{N+3,k} = U^T_{N+3,k} \lambda^{-1} R^{-1}_{N+3,k-1},$$

$$\gamma_{N+3,k} = 1 - C_{N+3,k} U_{N+3,k} = \frac{1}{1 + \tilde{C}_{N+3,k} U_{N+3,k}}$$

where $U_{N+3,k} = \bar{U}_{N+3,k} \bar{\sigma}^T$ is the extended input data vector at time k.

Fast Kalman Algorithm

The first Fast RLS algorithm (introduced in 1976) was the Fast Kalman algorithm, shown in Table 1. The Fast Kalman algorithm works with $C_k$, the entries of which have a lower dynamic range than the entries of $\tilde{C}_k$, a desirable property for fixed-point implementation. In the table, the quantity $C_k^{P_D}$ denotes the entries in $C_{N+3,k}$ that are in the same (column) positions as the entries of $I_3$ in $D_{k=[I_3 - \underline{D}_k]P_D}$. Similarly, the quantity $C_k^{P_A}$ will be used, which are the entries in $C_{N+3,k}$ that are in the same (column) positions as the entries of $I_3$ in $A_k = [I_3 - \underline{A}_k]P_A$. The table shows the computational complexity of the algorithm, measured by the number of multiplications or additions (or approximately the number of multiply-accumulates) that need to be performed. These complexities are indicated for the general case of q channels. In the FS DFE example, q=3.

Fast Transversal Filter (FTF) Algorithm

The Fast Transversal Filter algorithm (see Table 2) works with $\tilde{C}_k$ (just like the RLS algorithm), which results in the lowest computational complexity. Whereas the FKA computes the backward prediction error $r_k^P$ as the output of the backward prediction filter $D_{k-1}$, the FTF algorithm avoids this inner product and finds $r_k^P$ by the manipulation of scalar (in the single channel case) quantities.

TABLE 1

The Fast Kalman Algorithm (FKA).

| T1 | Fast Kalman Algorithm | x, + |
|---|---|---|
| prediction part | | |
| 1 | $e_k^P = A_{k-1} U_{N+q,k}$ | qN |
| 2 | $A_k = A_{k-1} - e_k^P [0\ C_{k-1}]$ | qN |
| 3 | $e_k = A_k U_{N+q,k}$ | qN |
| 4 | $\alpha_k = \lambda \alpha_{k-1} + e_k e_k^{PT}$ | $2q^2$ |
| 5 | $C_{N+q,k} = [0\ C_{k-1}]P_A + e_k^T \alpha_k^{-1} A_k$ | $qN + O(q^3)$ |
| 6 | $r_k^P = D_{k-1} U_{N+q,k}$ | qN |
| 7 | $D_k = (I_q - r_k^P C_k^{PD})^{-1}(D_{k-1} - r_k^P C_{N+q,k})$ | $(3q-1)N + O(q^2)$ |
| 8 | $[0\ C_k] = C_{N+q,k} P_D^T - C_k^{PD} D_k$ | qN |
| filtering part | | |
| 9 | $\epsilon_k^P = d_k - W_{k-1} U_k$ | N |
| 10 | $W_k = W_{k-1} + \epsilon_k^P C_k$ | N |
| | total complexity | $(9q+1)N + O(q^3)$ | as a result, however, the FTF algorithm is numerically less stable than the FKA in the sense that round-off errors grow faster. It is possible to combine the two ways of computing the signal $r_k^P$ to create a measurement of the round-off error subsystem associated with the algorithm, and to feed measurement to stabilize the unstable error propagation subsystem of the algorithm.

Initialization of Fast RLS

In the foregoing Fast RLS algorithm, the following initialization is performed. Filtering part:

1. $W_{k=-1} = W_{-1}$ corresponding to $\bar{d}_{-1} = W_{-1} \bar{U}_{-1}$ (implicitly).
2. Usually, $\bar{d}_{-1} = 0$ and $W_{-1} = 0$.

Prediction part:

TABLE 2

The Fast Transversal Filter (FTF) algorithm.

| T2 | Fast Transversal Filter (FTF) Algorithm | x, + |
|---|---|---|
| prediction part | | |
| 1 | $e_k^P = u_k - \underline{A}_{k-1} U_{k-1}$ | qN |
| 2 | $\tilde{C}_k^{PA} = e_k^{PT} \lambda^{-1} \alpha_{k-1}^{-1}$ | $2q^2$ |
| 3 | $\tilde{C}_{N+q,k} P_A^T = [0\ \tilde{C}_{k-1}] + \tilde{C}_k^{PA}[I_q - \underline{A}_{k-1}]$ | qN |
| 4 | $\gamma_{N+q,k}^{-1} = \gamma_{k-1}^{-1} + \tilde{C}_k^{PA} e_k^P$ | q |
| 5 | $r_k^P = \lambda \beta_{k-1} \tilde{C}_k^{PD^T}$ | $2q^2$ |
| 6 | $[0\ \tilde{C}_k] = (\tilde{C}_{N+q,k} P_A^T)(P_A P_D^T) - \tilde{C}_k^{PD}[I_q - \underline{D}_{k-1}]$ | qN |
| 7 | $\gamma_k^{-1} = \gamma_{N+q,k}^{-1} - \tilde{C}_k^{PD} r_k^P$ | q |
| 8 | $e_k = e_k^P \gamma_{k-1}$ | q |
| 9 | $\underline{A}_k = \underline{A}_{k-1} + e_k \tilde{C}_{k-1}$ | qN |
| 10 | $\alpha_k^{-1} = \lambda^{-1} \alpha_{k-1}^{-1} - \tilde{C}_k^{PAT} \gamma_{N+q,k} \tilde{C}_k^{PA}$ | $(1 \div) q^2 + q$ |
| 11 | $r_k = r_k^P \gamma_k$ | $(1 \div) q$ |
| 12 | $\underline{D}_k = \underline{D}_{k-1} + r_k \tilde{C}_k$ | qN |
| 13 | $\beta_k = \lambda \beta_{k-1} + r_k r_k^T$ | $q^2$ |
| filtering part | | |
| 14 | $\epsilon_k^P = d_k - W_{k-1} U_k$ | N |
| 15 | $\epsilon_k = \epsilon_k^P \gamma_k$ | 1 |
| 16 | $W_k = W_{k-1} + \epsilon_k \tilde{C}_k$ | N |
| | total complexity | $(2 \div)(5q+2)N + 6q^2 + 5q + 1$ |

1.

$$U_{N+q,-1} \text{ or } \begin{bmatrix} \bar{\sigma} \\ \bar{U}_{-1} \end{bmatrix}$$

are permutations of diagonal matrices.

2. Hence the LS estimate of any row from any other row(s) is 0.
3. For the filters, $$\underline{A}_{-1} = \underline{D}_{-1} = \tilde{C}_{-1} = C_{-1} = 0.$$

4. For the error energies (the energy of the signal that is being estimated):

$$\beta_{-1} = \bar{r}_{-1}\bar{r}_{-1}^T = \bar{u}'_{-1}\bar{u}'^T_{-1} = \begin{bmatrix} \mu_B & 0 \\ 0 & \lambda^{n_B+1}\mu_F I_2 \end{bmatrix}$$

$$\alpha_{-1} = \bar{e}_{-1}\bar{e}_{-1}^T = \bar{u}_{-1}\bar{u}_{-1}^T = \begin{bmatrix} \lambda^{n_B}\mu_B & 0 \\ 0 & \lambda^{n_B+n_F+1}\mu_F I_2 \end{bmatrix} = \beta_{-1}\begin{bmatrix} \lambda^{n_B} & 0 \\ 0 & \lambda^{n_F} I_2 \end{bmatrix}$$

$$\gamma - 1 = \sigma\sigma^T = 1$$

Lowest Complexity Fast Kalman Algorithm

The FTF algorithm works with $\tilde{C}_k$ whereas the FKA works with $C_k$. For $\tilde{C}_k = U_k^T \lambda^{-1} R_{k-1}^{-1}$ in the prewindowing transient phase, the last non-zero coefficients for the different channels put together give $$[s_0 y_o^T] \begin{bmatrix} \lambda^{n_B+1}\mu_B & 0 \\ 0 & \lambda^{n_B+n_F+2}\mu_F I_2 \end{bmatrix}^{-1}$$

which shows that for small initialization constants $\mu_B$, $\mu_F$, the overnormalized Kalman gain $\tilde{C}_k$ will take on large values during the transient phase. The unnormalized Kalman gain $C_k = U_k^T R_k^{-1}$ suffers much less from this problem since the "denominator" $R_k$ contains the latest data $U_k$. This problem of larger dynamic range for $\tilde{C}_k$ compared to $C_k$ manifests itself more generally whenever a sudden increase in the input signal level occurs. This motivates (with an eye toward fixed-point implementation) the use of $C_k$ over $\tilde{C}_k$. The algorithm shown in Table 3 uses $C_k$ as in the FKA. It also computes the backward prediction error by straightforward filtering as in the FKA (as opposed to avoiding this inner product after the manner of the FTF algorithm). This leads to a less unstable algorithm. Finally, note that as a result the algorithm does not require $\beta_k$ (required in the FTF algorithm). These are the most important characteristics of the FKA, and hence the resulting fast RLS algorithm can appropriately be called an FKA, albeit the fastest version of the FKA.

TABLE 3

Lowest complexity Fast Kalman Algorithm.

| T3 | Lowest Complexity FKA | x, + |
|---|---|---|
| prediction part | | |
| 1 | $e_k^P = u_k - \underline{A}_{k-1} U_{k-1}$ | qN |
| 2 | $\tilde{C}_k^{PA} = e_k^{PT} \lambda^{-1} \alpha_{k-1}^{-1}$ | $2q^2$ |
| 3 | $\gamma_{N+q,k} = \gamma_{k-1}/(1 + \gamma_{k-1} \tilde{C}_k^{PA} e_k^P)$ | (1 ÷) q +1 |
| 4 | $\alpha_k^{-1} = \lambda^{-1} \alpha_{k-1}^{-1} - \tilde{C}_k^{PAT} \gamma_{N+q,k} \tilde{C}_k^{PA}$ | $q^2 + q$ |
| 5 | $\underline{A}_k = \underline{A}_{k-1} + e_k^P C_{k-1}$ | qN |
| 6 | $C_{N+q,k} P_A^T = [0\ C_{k-1}] + \gamma_{N+q,k} \tilde{C}_k^{PA} [I_q - \underline{A}_k]$ | qN |
| 7 | $r_k^P = u_k' - \underline{D}_{k-1} U_k$ | qN |
| 8 | $\gamma_k \gamma_{N+q,k}^{-1} = 1/(1 - C_k^P r_k^P)$ | (1 ÷) q |
| 9 | $\gamma_k = (\gamma_k \gamma_{N+q,k}^{-1}) \gamma_{N+q,k}$ | 1 |
| 10 | $[0\ C_k] = (\gamma_k \gamma_{N+q,k}^{-1})[(C_{N+q,k} P_A^T)(P_A P_D^T) - C_k^{PD}[I_q - \underline{D}_{k-1}]]$ | (q + 1)N |
| 11 | $\underline{D}_k = \underline{D}_{k-1} + r_k^P C_k$ | qN |
| filtering part | | |
| 14 | $\epsilon_k^P = d_k - W_{k-1} U_k$ | N |
| 15 | $W_k = W_{k-1} + \epsilon_k^P C_k$ | N |
| | total complexity | (2 ÷) (6q + 3)N + $3q^2$ + 3q + 2 |

In Matlab notation (for portions of vectors): $C_k^{PD} = C_{N+q,k}[N_{fb}+1, N+2, N+3]$, whereby line 10 in Table 3 can be rewritten as $$C_k = (\gamma_k \gamma_{N+q,k}^{-1})[(C_{N+q,k} P_A^T)[1, 4:N_{fb}+2, 2, 3, N_{fb}+4:N-2] + C_k^{PD} \underline{D}_{k-1}].$$

Since $\gamma_k \gamma_{N+q,k}^{-1} > 1$, the implementation of the multiplication with this number on a fixed-point processor may take more than one cycle.

The least complex computation of the LS filter estimate would be to solve the normal equations with the generalized Levinson algorithm. However, this may be more sensitive in a fixed-point Prewindowing/Initialization Removal Postprocessing It is clear that avoiding the prewindowing assumption and the initialization (when $W_{-1}$ is not particularly close to $W^0$) would lead to much faster and better convergence. (The influence of the initialization can be made small by choosing $\mu_B$, $\mu_F$ small, but a fixed-point implementation, specially, will pose constraints on how small these quantities can be made.) With initialization and prewindowing, exponential weighting needs to be applied, not so much to adapt to changing statistics, but simply to forget the initialization and the prewindowing. Without the perturbation of initialization or prewindowing, no exponential weighting would need to be applied. This would lead to better estimation performance and fewer numerical problems.

To be robust against changing statistics later on in time, tracking performance could still be obtained without exponential forgetting by processing the data in bursts and at each burst incorporating as initialization the filter setting resulting from processing the previous burst with appropriate weighting. (In this case, the initialization would not have to be gotten rid off, only the prewindowing.)

A straightforward way to avoid prewindowing is to use the Growing Window Covariance (GWC) version of the FKA. In this fast RLS algorithm: the LS problem corresponding to the covariance window in FIG. 2 is solved at each time instant k. This algorithm is more complex than the prewindowed version. Indeed, it requires the introduction of an additional filter G, the dual Kalman gain, which needs to be updated also at every time instant. The GWC FKA may also be more sensitive for a fixed-point implementation (due to larger dynamics of quantities).

As mentioned earlier, in many applications it may not be possible to run a fast RLS algorithm in real-time to get initial convergence, due to complexity considerations. On the other hand, it may also be overkill to keep a fast RLS algorithm running to adapt to slow variations in the optimal filter settings. In this case: data should initially be acquired and stored. Then a fast RLS algorithm can be run off-line to converge on these data. The amount of data to be stored and processed should be such that it allows the LS filter estimate to have close to optimal performance (small excess MSE). For instance, an amount of data corresponding to k=10N should be largely sufficient for equalization applications. If a covariance window is used, less data can be used if that leads to a more favorable memory/complexity/performance trade-off. If an FKA with initialization and prewindowing is used, however, much more data would normally be required to get comparable performance.

Now, given (as described above) that fast RLS algorithms with prewindowing have the lowest complexity, an effective strategy is to simply run the prewindowed FKA, possibly with relatively large initialization constants $\mu$ to dampen the dynamics of the (fixed-point) quantities. This will be done over a burst of data such that the corresponding covariance window LS problem gives acceptable performance (so the data length is relatively short). At the end of the burst, a postprocessing FKA algorithm is run which will now remove the initial data vectors (hence the initialization constants in $R_{-1}$ and the prewindowing). This will have a lower overall complexity than running a GWC version of the FKA.

Downdating RLS Algorithm

To formulate the postprocessing algorithm, data matrices are needed which not only have an end time k but also a starting time j (j=−∞ in principle in the prewindowed case). With the initialization of FIG. 2, a starting time j=−∞ is in fact equivalent to j=−N−q since all data prior to that instant are zero. So the filter becomes the solution of the following LS problem $$W_{j,k} = \arg\min_W \sum_{i=j}^{k} \lambda^{k-i} \epsilon_i^2(W)$$

$$= \arg\min_W \|\epsilon_{j,k}(W)\|^2 = \arg\min_W \|\overline{d}_{j,k} - W\overline{U}_{j,k}\|^2$$

To obtain an RLS algorithm, the problem then is to find recursions to move j forward in time, until the prewindowing period is passed, so from about j=−N−q to j=n−1 where n=max{$n_B$, $n_F$} if both initialization and prewindowing need to be removed, or from 0 to n−1 if only prewindowing needs to be removed. Since the postprocessing consists of making the data window shorter by removing data at the beginning of the window, the resulting processing can be called downdating (as opposed to the usual updating).

From the recursive relations:

$$\begin{cases} \overline{d}_{j+1,k}\overline{U}_{j+1,k}^T = \overline{d}_{j,k}\overline{U}_{j,k}^T - \lambda^{k-j} d_j U_j^T \\ R_{j+1,k} = R_{j,k} - \lambda^{k-j} U_j U_j^T \end{cases}$$

the following recursion is obtained for $W_{j,k}$:

$$W_{j+1,k} = W_{j,k} - \lambda^{k-j}\underbrace{(d_j - W_{j,k}U_j)}_{\epsilon_{j,k}=\epsilon_j(W_{j,k})}\underbrace{U_j^T R_{j+1,k}^{-1}}_{\tilde{G}_{j,k}} = W_{j,k} - \lambda^{k-j}\epsilon_{j,k}G_{j,k}$$

where $\tilde{G}_{j,k}$ is a (overnormalized) dual Kalman gain, this time not to reflect the effect of adding a data point at the end, but of removing a data point at the beginning. Furthermore, the (unnormalized) dual Kalman gain is $G_{j,k}=U_j^T R_{j,k}^{-1}$. Note that $\lambda^{k-j}G_{j,k}$ is like $W_{j,k}$ with $\overline{d}_{j,k}$ replaced by $\overline{\pi}=$ $$\begin{bmatrix} 0 & \cdots & 0 & \lambda^{\frac{k-j}{2}} \end{bmatrix}: \lambda^{k-j}G_{j,k} = \overline{\pi}\overline{U}_{j,k}^T R_{j,k}^{-1} = \lambda^{k-j}U_j^T R_{j,k}^{-1}.$$

The quantity $\overline{\pi}$ is called the dual pinning vector. it pins down (and weighs) the oldest sample. The dual Kalman gain $G_{j,k}$ is the filter for estimating $\overline{\pi}$ from $\overline{U}_{j,k}$ with error signal = $\overline{\pi}-\lambda^{k-j}G_{j,k}\overline{U}_{j,k}$ and error energy=$(\overline{\pi}-\lambda^{k-j}G_{j,k}\overline{U}_{j,k})\overline{\pi}^T=\lambda^{k-j}\delta_{j,k}$ where $$\delta_{j,k} = 1 - \lambda^{k-j}G_{j,k}U_j =$$

$$1 - \lambda^{k-j}U_j^T R_{j,k}^{-1}U_j = \frac{1}{1+\lambda^{k-j}\tilde{G}_{j,k}U_j} = \frac{1}{1+\lambda^{k-j}U_j^T R_{j+1,k}^{-1}U_j} \in (0,1].$$

Again, a relation of the form $G_{j,k}=\delta_{j,k}\tilde{G}_{j,k}$ is obtained. To find a recursion for $R_{j,k}^{-1}$, the Matrix Inversion Lemma is again applied on $R_{j+1,k}=R_{j,k}-\lambda^{k-j}U_j U_j^T$. The downdating RLS algorithm, which is a recursion for $W_{j,k}$, $R_{j,k}^{-1} \to W_{j+1,k}$, $R_{j+1,k}^{-1}$ with initialization $W_{-N-q,k}=W_k$, $R_{-N-q,k}^{-1}=R_k^{-1}$ can then be formulated as follows:

$$\begin{cases} \epsilon_{j,k} = d_j - W_{j,k}U_j \\ G_{j,k} = U_j^T R_{j,k}^{-1} \\ \delta_{j,k} = 1 - \lambda^{k-j}G_{j,k}U_j \\ W_{j+1,k} = W_{j,k} - \epsilon_{j,k}\lambda^{k-j}\delta_{j,k}^{-1}G_{j,k} \\ R_{j+1,k}^{-1} = R_{j,k}^{-1} + G_{j,k}^T\lambda^{k-j}\delta_{j,k}^{-1}G_{j,k} \end{cases} \text{ Riccati equation.}$$

The corresponding downdate equation for the LS error energy (if desired)is given by:

$$\xi_{j+1,k}=\xi_{j,k}-\epsilon_{j,k}\lambda^{k-j}\delta_{j,k}^{-1}\epsilon_{j,k}^T$$

where the latter transposition operation is required only if $\epsilon_{j,k}$ is a vector signal (not the case for a DFE).

Downdating Fast Kalman Algorithm

To find a downdating fast RLS algorithm, the shift structure in the data can again be exploited, of which the details are now:

$$\begin{bmatrix} \overline{u}'_{j,k} \\ \overline{U}_{j,k} \end{bmatrix} = P_D\overline{U}_{N+3,j,k} = P_D P_A^T \begin{bmatrix} \overline{u}_{j,k} \\ \overline{U}_{j-1,k-1} \end{bmatrix}$$

which means that going from the old data $\overline{U}_{j-1,k-1}$ to the new data $\overline{U}_{j,k}$ can be accomplished by shifting in new data $\overline{u}_{j,k}$ (temporarily leading to an extended data matrix $\overline{U}_{N+3,j,k}$) and shifting out old data $\overline{u}'_{j,k}$. To get a complete downdating strategy which will be used to downdate $G_{j-1,k}$ to $G_{j,k}$, the regular time updating strategy (involving the regular Kalman gain $C_{j,k}$) is first used to downdate $G_{j-1,k}$ to $G_{j-1,k-1}$ and then the shift structure is used (involving foward and backward prediction filters) to update $G_{j-1,k-1}$, to $G_{j,k}$. The derivations are along the same lines as for the FKA/FTF algorithms. The resulting algorithm is shown in Table 4.

Just as the updating algorithm requires initialization, so also the downdating algorithm requires initialization. The following initialization (at j=−1, if the desired is to get rid of prewindowing only) may be used: W,A,D,C,$\alpha^{-1}$, γ are initialized by their values obtained from the prewindowed algorithm, and $G_{-1,k}$=0, $\delta_{-1,k}$=1. The initialization can be placed earlier to get rid of the soft constraint initialization ($W_{-1}$, $R_{-1}$) also. (This is done using the same initialization values, only the signal values to be processed during the downdating become more numerous). When downdating the soft constraint initialization, the complexity can be reduced by 3N−3 if the fact that the $U_j$ contain only one non-zero entry gets exploited.

Prewindowing Suppression for the Filtering Section

The filtering (equalization) error signal shows large values during the initial convergence of the algorithms. One would expect, however, that this would not be the case when the filter W is initialized to some setting $W_{-1}$ that is relatively close to the optimal setting (as a result of previous adaptation). However, things are perturbed due to the prewindowing, which will lead good filter settings to produce a large error signal during the prewindowing transient. The prior art (Eleftheriou and Falconer) describes a solution to this problem. The solution consists of still using the prewindowed input data vector $U_k$ for the prediction part of the fast RLS algorithm, so that a fast algorithm is possible, but to introduce a different data vector, $U'_k$, for the filtering section. $U'_k$ is the same as $U_k$ except that it's not prewindowed. So $U'_k$ differs from $U_k$ only during the prewindowing transient, in which period $U'_k$ contains some actual data from before time zero (assuniing this data is available but was simply not used due to the algorithmic constraints of prewindowed fast RLS algorithms). So in this case, the filtering error signal is actually computed as $$\epsilon_k^p = d_k - W_{k-1} U_k'$$

$$= (d_k - W_{k-1}(U_k' - U_k)) - W_{k-1} U_k$$

$$= d_k' - W_{k-1} U_k$$

where $U'_k - U_k$ is non-zero, and $d'_k$ is different from $d_k$, only during the prewindowing transient. So things happen as if the prewindowinig assumption is still used, but with a (temporarily) modified desired-response signal $d'_k$ which compensates as well as it can for the prewindowing assumption (since before updating at time k, $W_{k-1}$ is our best estimate for W). The filtering error thus computed does not get perturbed by prewindowing and hence does not show particularly large values during the prewindowing (not larger than what $W_{-1}$ can deliver).

To incorporate this modification in the postprocessing, it suffices to use $d'_k$ instead of $d_k$ ($U'_k$ does not need to be used). Indeed, the filter estimate would have been exactly the same if prewindowing ($U_k$) in the filtering section was used, with $d'_k$ as desired response signal.

Partial Cancellation of the Initialization

It is trivially possible to cancel the initialization only partially. This may be desirable if the initialization constants were chosen oil the basis of numerical considerations, whereas after cancellation, the objective is for the constants to take on (smaller) values that correspond to certain statistical estimation considerations (Bayesian point of view).

Indeed, if for the postprocessing purposes, $\mu_F$, $\mu_B$ are set to values $\mu'_F < \mu_F$, $\mu'_B < \mu_B$, then after postprocessing the initialization will still influence the filter estimate, but now according to the constants $\mu_F - \mu'_F$, $\mu_B - \mu'_B$.

Updating and Tracking by Processing Data in Bursts

To make up for the fact that the available processing power may be insufficient to run fast RLS algorithms in real time, data can he stored and processed in bursts of length and frequency such that the processing of a burst is finished before the next burst of data arrives. To incorporate the results from processing previous data bursts, when processing the next burst, the (soft constraint) initialization mechanism can be used. To have an appropriate weighting of the previous results, the following initialization values can be used: put $\underline{A}$, $\underline{D}$, C, U to 0, $\gamma$ to 1, and leave $\alpha^{-1}$ and W unchanged. This corresponds to a pre- and postwindowed data matrix $\overline{U}_{-1}$ with block-diagonal (3×3 blocks) $R_{-1}$. The advantage of such a simple initialization is that the numerical errors associated with critical (unstable) quantities are flushed out. The appropriate weighting is provided by leaving $\alpha^{-1}$ unchanged. If $\lambda=1$ is used, then the filter estimate is the result of all the data bursts processed (not in the usual LS sense though, but in some weighted version of it). Forgetting, to track possible changes in the environment, can be introduced by taking $\lambda<1$. Alternatively, one can take $\lambda=1$ but weigh $\alpha^{-1}$: $\alpha^{-1} \leftarrow \lambda_1^{-1} \alpha^{-1}$ at initialization, where $\lambda_1$ is some burst-level forgetting factor. Or one can use a combination of both weighting mechanisms.

Obviously, when incorporating information from previous bursts, the initialization should not be removed by postprocessing (postprocessing should then only be applied to the prewindowing transient).

TABLE 4

Postprocessing Fast Kalman Algorithm to transform the initialized/prewindowed LS estimate into a Covariance Window LS estimate.

| T4 | Downdating FKA | x + |
|---|---|---|
| prediction part | | |
| 1 | $\eta_{j-1,k} = C_{j-1,k} U_{j-1}$ | N |
| 2 | $\gamma_{j,k} \gamma_{j-1,k}^{-1} = 1 - \lambda^{k-j+1} \gamma_{j-1,k}^{-1} \delta_{j-1,k}^{-1} \eta_{j-1,k}^2$ | 4 |
| 3 | $\gamma_{j,k}^{-1} = (\gamma_{j,k} \gamma_{j-1,k}^{-1})^{-1} \gamma_{j-1,k}^{-1}$ | (1 ÷) 1 |
| 4 | $C_{j,k} = C_{j-1,k} + \lambda^{k-j+1} \delta_{j-1,k}^{-1} \eta_{j-1,k} G_{j-1,k}$ | N |
| 5 | $\delta_{j-1,k}^{-1} = (\gamma_{j,k} \gamma_{j-1,k}^{-1})^{-1} \delta_{j-1,k}^{-1}$ | 1 |
| 6 | $G_{j-1,k-1} = \lambda \gamma_{j,k} \gamma_{j-1,k}^{-1} G_{j-1,k} + \lambda \gamma_{j-1,k}^{-1} \eta_{j-1,k} C_{j,k}$ | 2N + 2 |
| 7 | $e_{j,k} = u_j - \underline{A}_{j,k} U_{j-1}$ | qN |
| 8 | $G_{j,k}^{PA} = e_{j,k}^T \alpha_{j,k}^{-1}$ | $q^2$ |
| 9 | $\delta_{N+q,j,k}^{-1} = \delta_{j-1,k-1}^{-1}/(1 - \lambda^{k-j} \delta_{j-1,k-1}^{-1} G_{j,k}^{PA} e_{j,k})$ | (1 ÷) q + 3 |
| 10 | $\alpha_{j+1,k}^{-1} = \alpha_{j,k}^{-1} + \lambda^{k-j} \delta_{N+q,j,k} G_{j,k}^{PA T} G_{j,k}^{PA}$ | $q^2$ + q + 1 |
| 11 | $G_{N+q,j,k}^{PA T} = [0 \ G_{j-1,k-1}] + G_{j,k}^{PA} [I_q - \underline{A}_{j,k}]$ | qN |
| 12 | $\underline{A}_{j+1,k} = \underline{A}_{j,k} - \lambda^{k-j} \delta_{j-1,k-1}^{-1} e_{j,k} G_{j-1,k-1}$ | qN + q |
| 13 | $r_{j,k} = u_j' - \underline{D}_{j,k} U_j$ | qN |
| 14 | $\delta_{j,k}^{-1} = \delta_{N+q,j,k}^{-1}/(1 + \lambda^{k-j} \delta_{N+q,j,k}^{-1} G_{j,k}^{PD} r_{j,k})$ | (1 ÷) q + 2 |
| 15 | $[0 \ G_{j,k}] = (G_{N+q,j,k} P_A^T) (P_A P_D^T) - G_{j,k}^{PD} [I_q - \underline{D}_{j,k}]$ | qN |
| 16 | $\underline{D}_{j+1,k} = \underline{D}_{j,k} - \lambda^{k-j} \delta_{j,k}^{-1} r_{j,k} G_{j,k}$ | qN + q + 1 |
| filtering part | | |
| 17 | $\epsilon_{j,k} = d_j - W_{j,k} U_j$ | N |
| 18 | $W_{j+1,k} = W_{j,k} - \lambda^{k-j} \delta_{j,k}^{-1} \epsilon_{j,k} G_{j,k}$ | N + 1 |
| | total complexity | (3 ÷) (6q + 6)N + $2q^2$ + 5q + 16 |

Use of the described postprocessing fast Kalman algorithm shows that equivalent results as conventional algorithms can be obtained using from six to sixteen times less data than conventional algorithms.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A method of performing recursive adaptation of a digital filter computed using at least a filter coefficient vector or matrix, a desired response data vector or matrix and an input data matrix, the method comprising:

storing a burst of input data;

storing or deriving corresponding desired response data;

using prewindowing to initialize the desired response data vector and the input data matrix;

running a prewindowed fast RLS-type adaptation algorithm on the burst of data to compute filter coefficients at the end of the burst of data; and performing postprocessing to adjust the filter coefficients to remove the effects of prewindowing.

2. The method of claim 1, wherein the filter coefficients are adjusted to be more nearly optimal in accordance with a covariance window Least Squares error criterion.

3. The method of claim 1, wherein the digital filter is computed using a sample covariance matrix, the method further comprising:

initializing the input data matrix with at least some fictitious non-zero data at positions in the input data matrix corresponding to instants i in time prior to i=0;

initializing at least one of the desired response data vector and the sample covariance matrix to agree with the input data matrix, including the fictitious data; and after running the filter, performing postprocessing to adjust the filter coefficients to remove the effects of the fictitious data.

4. The method of claim 3, further comprising:

storing a different burst of data;

initializing the filter coefficient matrix to values derived from values obtained from running the filter on a previous burst of data;

using prewindowing to initialize the input data matrix;

running the filter on the different burst of data to compute filter coefficients at the end of the burst of data; and performing postprocessing to adjust the filter coefficients to remove the effects of prewindowing.

5. The method of claim 4, comprising initializing at least one algorithmic quantity by adjusting a value obtained from running the filter on the previous burst of data.

6. The method of claim 5, wherein the algorithmic quantity is the forward prediction error energy.

7. The method of claim 6, wherein the forward prediction error energy is adjusted upward to reduce the dynamic range of at least one quantity.

8. The method of claim 7, further comprising, during postprocessing, removing an effect of some portion of the forward prediction error energy while preserving the effect of another portion of the forward prediction error energy.

9. The method of claim 8, comprising removing the effect of an excess portion of the forward prediction error energy equal to an amount by which the forward prediction error energy was adjusted upward.

10. The method of claim 6, wherein the forward prediction error energy is adjusted downward to reduce, from one burst to another, the influence of prior data, while using an exponential forgetting factor that is zero or substantially less than one.

11. The method of claim 4, further comprising modifying desired response data vector values to reduce a pronounced error transient experienced during initial stages of processing a burst of data.

12. The method of claim 11, further comprising saving modified desired response data vector values for use during postprocessing.

13. The method of claim 12, further comprising using the saved modified desired response data vector values to remove the effect of modification of the values.

* * * * *